United States Patent

Dennison et al.

Patent Number: 5,219,778
Date of Patent: Jun. 15, 1993

[54] STACKED V-CELL CAPACITOR

[75] Inventors: Charles H. Dennison; Ruojia Lee; Yauh-Ching Liu; Pierre Fazan, all of Boise, Id.

[73] Assignee: Micron Technology, Inc., Boise, Id.

[21] Appl. No.: 800,803

[22] Filed: Nov. 27, 1991

Related U.S. Application Data

[63] Continuation-in-part of Ser. No. 598,491, Oct. 16, 1990, abandoned.

[51] Int. Cl.⁵ .................. H01L 27/70; H01L 21/265
[52] U.S. Cl. .................................. 437/47; 437/52
[58] Field of Search .............. 437/60, 47, 52, 919; 357/23.6, 51; 365/149, 185; 257/301–316

[56] References Cited

U.S. PATENT DOCUMENTS

| | | | |
|---|---|---|---|
| 4,742,018 | 5/1988 | Kimura et al. | 437/48 |
| 4,981,810 | 1/1991 | Fazan et al. | 437/44 |
| 5,120,674 | 6/1992 | Chin et al. | 437/60 |
| 5,128,273 | 7/1992 | Ema | 437/60 |

FOREIGN PATENT DOCUMENTS

| | | |
|---|---|---|
| 0388075 | 9/1990 | European Pat. Off. |
| 2-152274 | 6/1990 | Japan |
| 2-246150 | 10/1990 | Japan |

OTHER PUBLICATIONS

"3-Dimensional Stacked Capacitor Cell for 16M and 64M DRAMS" by T. Ema et al., IEDM 88, pp. 592–595 (unknown date).
"A Spread Stacked Capacitor (SCC) for 64Mbit DRAMS" by S. Inoue et al., IEEE 89, pp. 2.3.1–2.3.4. (unknown date).

*Primary Examiner*—Olik Chaudhuri
*Assistant Examiner*—Loc Trinh
*Attorney, Agent, or Firm*—David J. Paul

[57] ABSTRACT

A stacked v-cell (SVC) capacitor using a modified stacked capacitor storage cell fabrication process. The SVC capacitor is made up of polysilicon structure, having a v-shaped cross-section, located at a buried contact and extending to an adjacent storage node overlaid by polysilicon with a dielectric sandwiched in between. The addition of the polysilicon structure increases storage capability 70% without enlarging the surface area defined for a normal stacked capacitor cell.

19 Claims, 6 Drawing Sheets

STACKED V-CELL CAPACITOR

This is a continuation-in-part to U.S. patent application Ser. No. 07/598,491, filed Oct. 16, 1990 now abandoned.

FIELD OF THE INVENTION

This invention relates to semiconductor circuit memory storage devices and more particularly to the design of 3-dimensional stacked cell capacitors used in high-density dynamic random access memory (DRAM) arrays.

BACKGROUND OF THE INVENTION

In dynamic semiconductor memory storage devices it is essential that storage node capacitor cell plates be large enough to retain an adequate voltage level in spite of parasitic capacitances and noise that may be present during circuit operation. As is the case for most semiconductor integrated circuitry, circuit density is continuing to increase at a fairly constant rate. The issue of maintaining storage node capacitance is particularly important as the density of DRAM arrays continue to increase for future generations of memory devices.

The ability to densely pack storage cells while maintaining required storage capabilities is a crucial requirement of semiconductor manufacturing technologies if future generations of expanded memory array devices are to be successfully manufactured.

One method of maintaining, as well as increasing, storage node size in densely packed memory devices is through the use of "stacked storage cell" design. With this technology, planarized layers of a conductive material such as polycrystalline silicon (polysilicon or poly) are deposited over an access device on a silicon wafer with dielectric layers sandwiched between each poly layer. A cell constructed in this manner is known as a stacked capacitor cell (STC). Such a cell utilizes the space over the access device for capacitor plates, has a low soft error rate (SER) and may be used in conjunction with interplate insulative layers having a high dielectric constant.

However, it is difficult to obtain sufficient storage capacitance with a conventional STC capacitor as the storage electrode area is confined within the limits of its own cell area. Also, maintaining high dielectric breakdown between poly layers in the STC capacitor becomes a major concern once insulator thickness is appropriately scaled.

A paper submitted by T. Ema, S. Kawanago, T. Nishi, S. Yoshida, H. Nishibe, T. Yabu, Y. Kodama, T. Nakano and M. Taguchi, entitled "3-DIMENSIONAL STACKED CAPACITOR CELL FOR 16M AND 64M DRAMS," IEDM, Dig. Tech. Papers, pp. 592-595, 1988, herein incorporated by reference, discusses a 3-dimensional stacked capacitor fin structure.

The fin structure and its development is shown in FIG. 1, pp. 593 of the article mentioned above. The storage node is formed by two polysilicon layers, called fins, with gaps between the fins (the number of fins can be increased, but is limited by design rules used). Capacitor dielectric film surrounds the whole surface of the fins with polysilicon (used for a capacitor cell plate) covering the fins and filling in the gaps. This design can be fabricated using current methods and increases storage capacitance, but it is not suitable for a deep submicron (such as 0.2 micron) design rule DRAM cell because the total thickness of several fins and cell plate is much larger than minimum feature size. The process flow, needed to realize this fin structure, requires precise alignment between two adjacent word lines and digits lines. This alignment along with the requirement to have the storage node poly overlap the storage node contact leads to a larger cell area that is not suitable for 0.2 micron design rules mentioned previously.

Also, in a paper submitted by S. Inoue, K. Hieda, A. Nitayama, F. Horiguchi and F. Masuoka, entitled "A SPREAD STACKED CAPACITOR (SSC) CELL FOR 64 MBIT DRAMS," IEDM, Dig. Tech. Papers, pp. 31-34, 1989, herein incorporated by reference, discusses a storage electrode of a 1st memory cell being expanded to the neighboring 2nd memory cell area.

The SSC cell fabrication process (refer to FIG. 2 pp. 32) begins with a storage electrode deposited above the digit lines that is expanded from the 1st memory cell to its adjacent memory cells and visa versa. This results in a stacked capacitor arrangement where each storage electrode can occupy two memory cell areas, thus almost doubling the storage capacitance of one memory cell.

However, the SSC process is complicated and adds at least two masks to the standard process and cannot be made with self-aligned contacts.

The present invention develops an existing stacked capacitor fabrication process to construct a 3-dimensional stacked capacitor cell by using self aligned contacts without additional photolithography steps.

SUMMARY OF THE INVENTION

The invention is directed to maximizing storage cell surface area in a high density/high volume DRAM (dynamic random access memory) fabrication process. An existing stacked capacitor fabrication process is modified to construct a 3-dimensional stacked $V_r$-cell (SVC) capacitor defined as a storage cell.

After a silicon wafer is prepared using conventional process steps, the present invention develops the SVC by creating a v-shaped poly structure conforming to the topology formed by three adjacent word lines running perpendicular to two adjacent digit lines, which results in increased capacitor plate surface area for each storage cell. Such a structure has the potential to increase the capacitance of a conventional STC cell by 70%.

The invention will allow the maintenance of adjacent capacitance within a DRAM cell as geometries are dramatically shrunk.

DETAILED DESCRIPTION OF THE PREFERRED EMBODIMENT

The invention is directed to maximizing storage cell surface area in a high density/high volume DRAM fabrication process, in a sequence shown in FIGS. 1–8.

A silicon wafer is prepared using conventional process steps up to the point of defining a cell array. Capacitor fabrication will now follow.

The capacitor of each cell will make contact with a buried contact within the cell, while the capacitor will extend to the active area of an adjacent cell. Each active area within the array is isolated from one another by a thick field oxide and arranged in interdigitated columns and non-interdigitated rows. Alternately, the active areas may be arranged simply in parallel columns and parallel rows. The active areas are used to form active MOS transistors that can be doped as NMOS or PMOS type FETs depending on the desired use.

Figure 1:
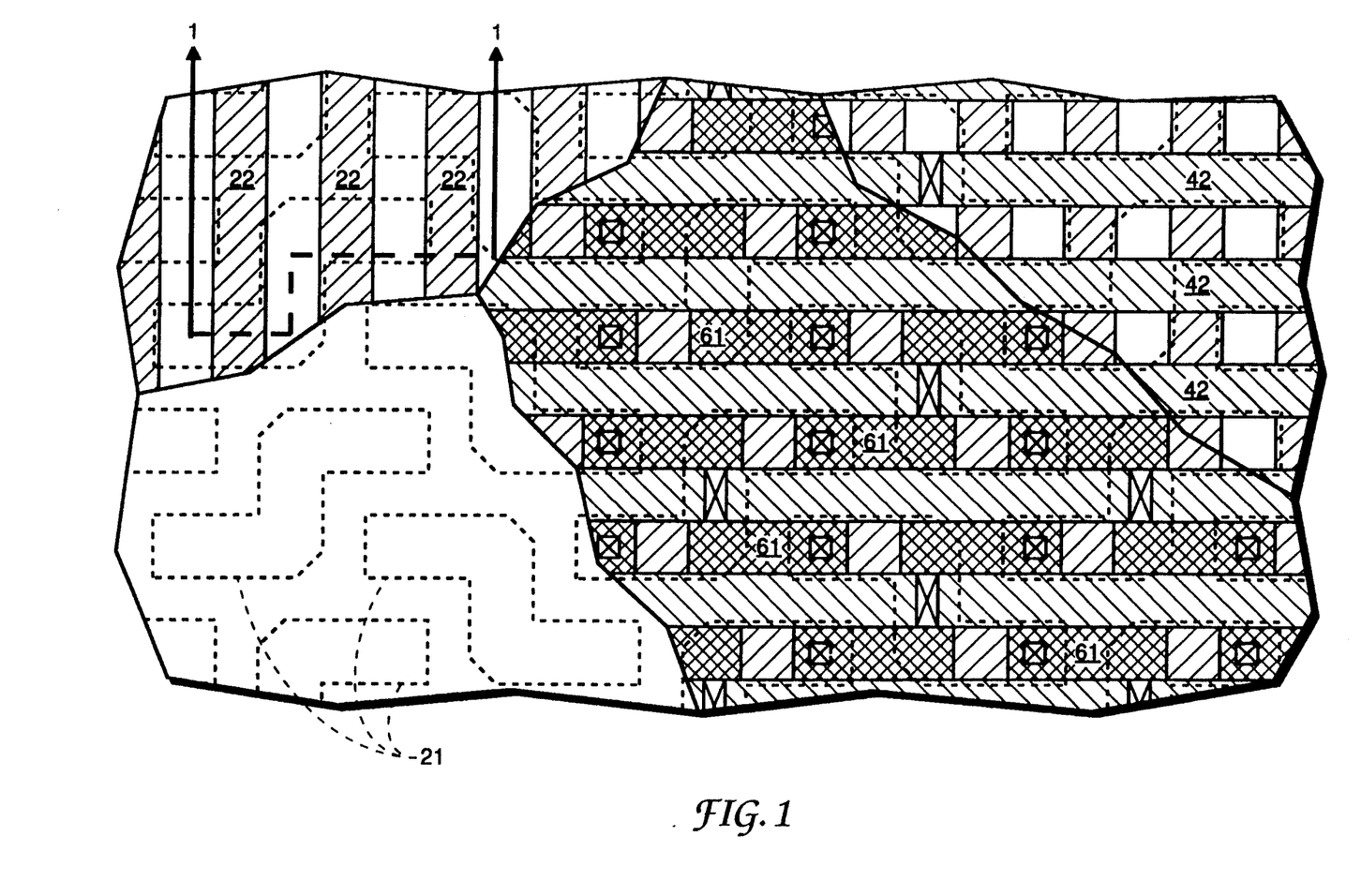
FIG. 1 is a top planar view of a portion of an in-process wafer showing digit lines, word lines, active areas and storage capacitors.

FIG. 1 shows a top planar view portion of a completed multilayered memory array with the main building blocks comprising digit lines 42, word lines 24, active area 21, and SVC storage node plates 61. Active areas 21 have been implanted in such a manner as to have each adjacent active area interweave with one another in the row direction (or word line direction) thereby forming parallel interdigitated rows of active areas 21. In the column direction (or digit line direction) each adjacent active area 21 run end to end thereby forming parallel non-interdigitated columns of active area. The stacked capacitor structure of the preferred embodiment (the SVC) is self-aligned to word lines 22 as well as to digit lines 42.

Figure 2:
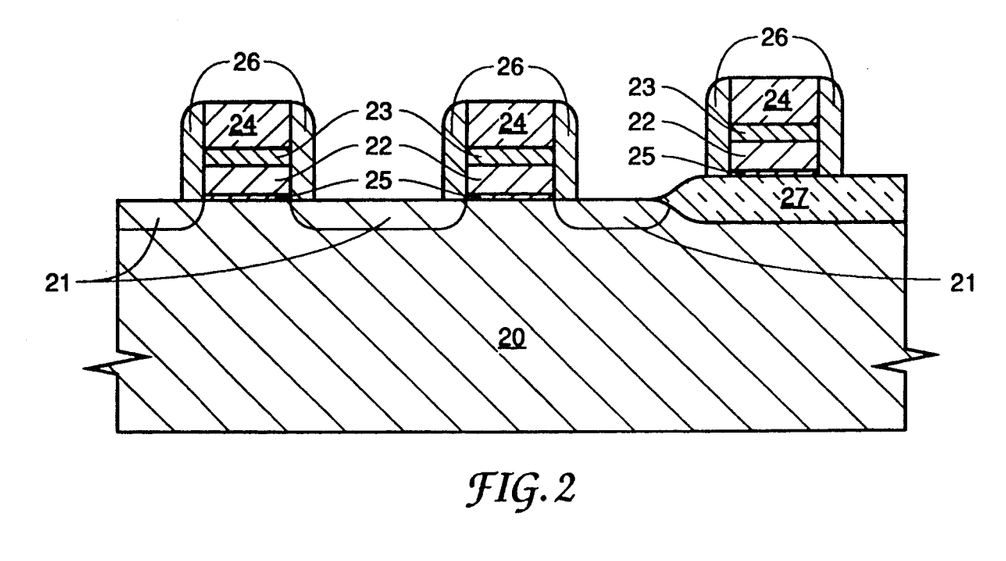
FIG. 2 is a cross-sectional view through broken line 1—1 of FIG. 1.

As shown in FIG. 2, parallel poly word lines 22, covered with silicide 23 and dielectric 24 (either oxide or nitride) and further isolated from subsequent conductive layers by dielectric spacers 26 (either oxide or nitride), have been previously deposited over a thin layer of gate oxide 25 or a thick layer of field oxide 27. Active areas 21 have been appropriately doped to a desired conductivity type which penetrates into the bulk silicon wafer 20, by conventional process steps. Now the wafer is ready for digit line formation that will run perpendicular to and over the top of word lines 22.

Figure 3:
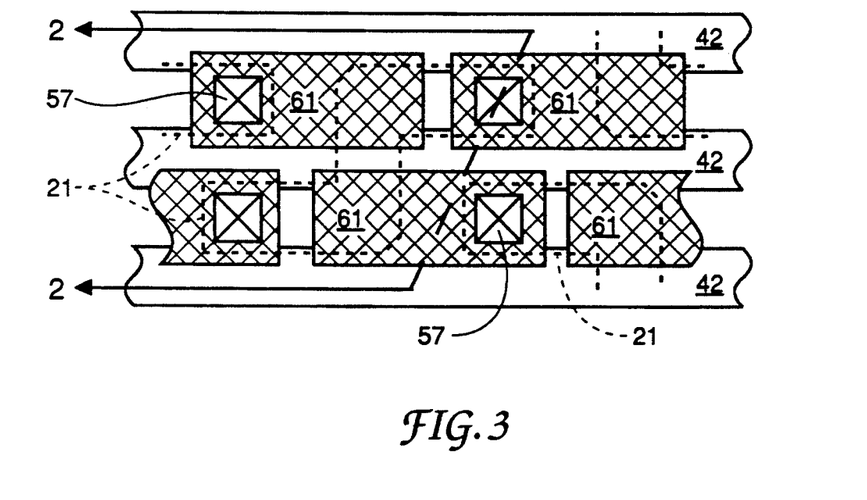
FIG. 3 is a top planar view of a portion of an in-process wafer showing digit lines, active areas, storage node contacts and storage capacitors.

FIG. 3 shows a top planar view of a portion of an in-process wafer showing active areas 21, digit lines 42, storage node contacts 57 and storage node plates 61.

Figure 4:
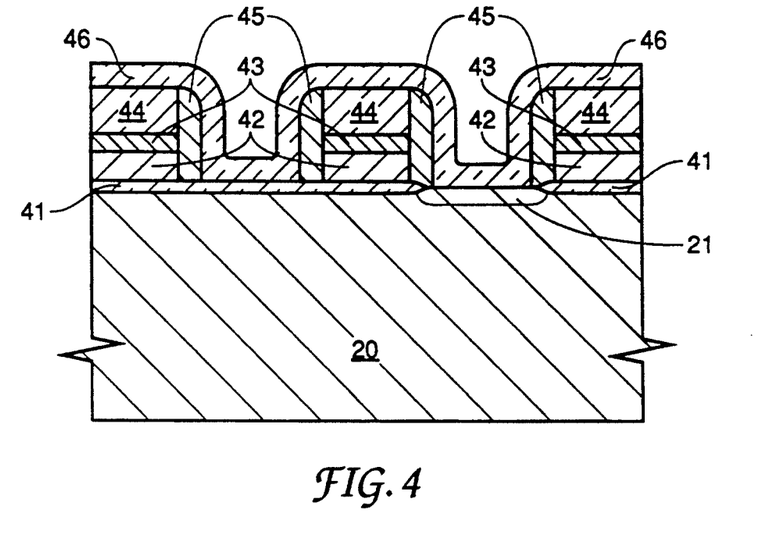
FIG. 4 is a cross-sectional view of the in-process wafer through broken line 2—2 of FIG. 3 following a blanket deposition of a conformal dielectric.

As shown in FIG. 4, an oxide layer 41 is deposited over the entire wafer array surface followed by a blanket deposition of polysilicon 42, silicide 43 and dielectric 44, respectively. Dielectric 44 can be either nitride or oxide and is deposited by chemical vapor deposition (CVD) which is preferred for its excellent conformity. The layers of polysilicon 42, silicide 43 and dielectric 44 are patterned and etched with polysilicon 42, previously being conductively doped, in conjunction with silicide 43 to serve as parallel digit lines 42 covered with dielectric layer 44. Digit lines 42 run perpendicular to and over the top of the word lines 21 shown in FIG. 2, and conform to the lower wafer surfaces between each word line thereby resulting in a waveform-like topology running in both the digit line and word line directions.

Up to this point, process flow has followed that of an array comprising conventional stacked capacitor cells. From this point forward, the process is unique to an array having SVC-type storage capacitors. A second dielectric 45, such as nitride or oxide is now deposited, followed by an anisotropic etch to form dielectric spacers 45. Digit lines 42 and their subsequent isolation layers are then covered with a dielectric 46 that is also either oxide or nitride, to a preferred thickness of 500 to 2000 angstroms by deposition.

In the preferred embodiment, when forming word line and digit line isolation, it is desirable to use one of the two following combinations of dielectrics. Referring to both FIGS. 2 and 4, combination one requires dielectrics 24 and 26 (FIG. 2), and dielectrics 44 and 45 (FIG. 4), to be oxides and dielectric 46 to be nitride. Combination two requires dielectrics 24 and 26 (FIG. 2), and dielectrics 44 and 45 (FIG. 4), to be nitride and dielectric 46 to be an oxide. The combination selected determines the etching step (discussed later in this description) used to construct the final poly capacitor structure desired. For example, combination one requires a nitride etching step, where combination two requires an oxide etching step.

Figure 5:
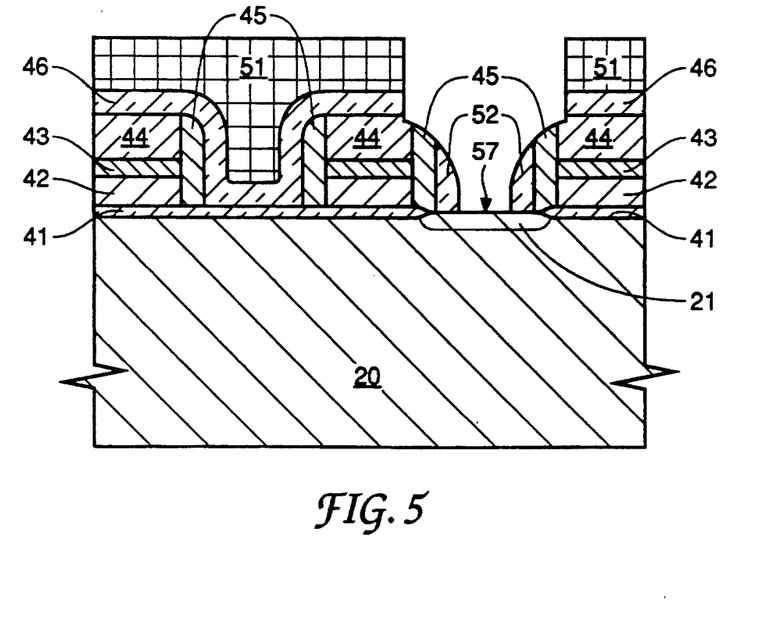
FIG. 5 is a cross-sectional view of the in-process wafer portion of FIG. 4 following a buried contact photo and etch.

As shown in FIG. 5, a buried contact 57, self-aligned to digit lines 42 by the presence of spacers 45, is located by covering all areas other than contact 57 with photoresist 51. After applying an appropriate photomask, a buried contact anisotropic etch on the exposed dielectric creates additional spacers 52 and provides an opening to locate contact 57.

Figure 6:
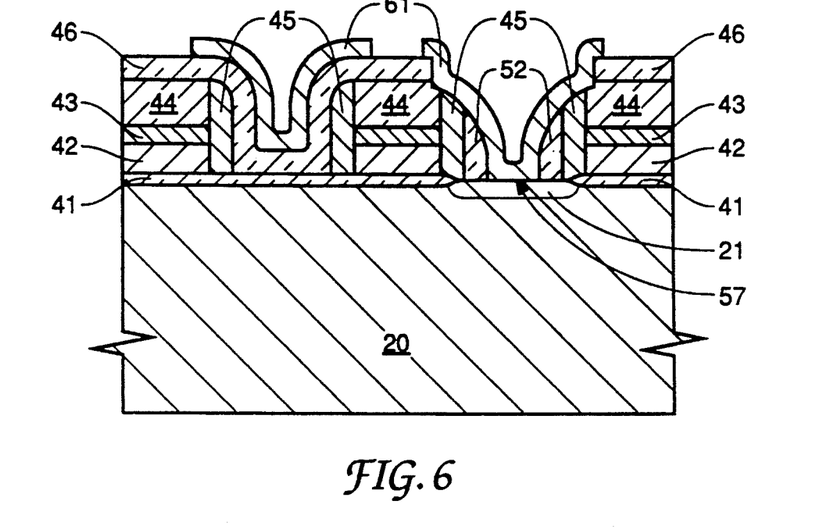
FIG. 6 is a cross-sectional view of the in-process wafer of portion of FIG. 5 following a photoresist strip, a blanket deposition of conformal poly followed by poly doping and patterning of a poly storage node.

As shown in FIG. 6, the photoresist has been stripped and a conformal poly layer 61 is deposited, preferably by low temperature deposition, over the entire array surface and couples to active area 21 via buried contact 57. The low temperature deposition causes poly layer 61 to have a rugged textured surface that potentially doubles the surface area of poly layer 61. Poly layer 61 is conductively doped and patterned to serve as a bottom plate 61 of the SVC storage capacitor. Plate 61 extends over an adjacent poly word line (the word line is not shown as it runs parallel to cross-sectional views of FIG. 6) and continues to the next adjacent word line. Plate 61 conforms to the two perpendicular waveform-like topology (created after digit line formation) which run in both the word lines and the digit lines directions.

Figure 7:
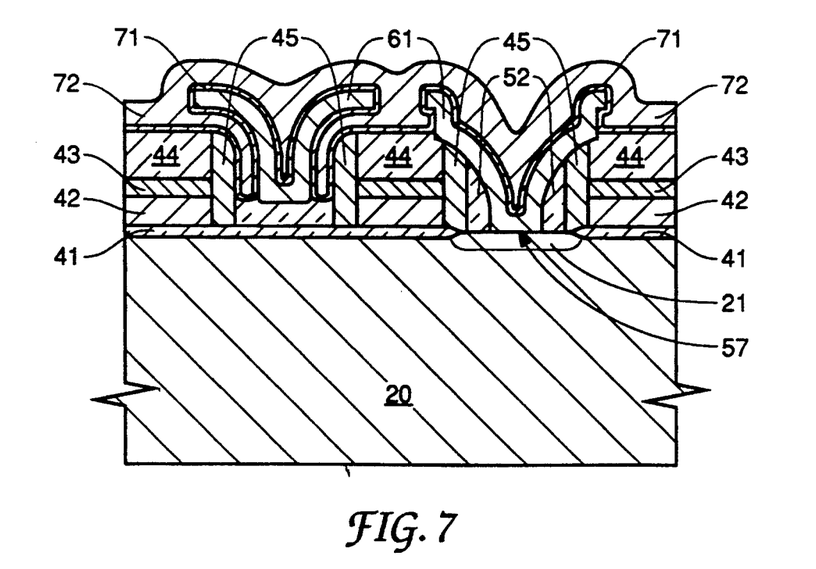
FIG. 7 is a cross-sectional view of the in-process wafer of portion of FIG. 6 following a controlled dielectric etch and blanket depositions of conformal nitride and poly.

As shown in FIG. 7, a controlled wet etch removes all but a portion of dielectric 46, in preparation for deposition of an isolation layer serving as a capacitor dielectric. If dielectric 46 is nitride a controlled nitride etch using phosphoric acid is preformed and if dielectric 46 is oxide a controlled oxide etch using hydrofluoric acid is performed. A dielectric layer of nitride 71 is deposited that conforms to both the inside and outside surfaces of plate 61. Following nitride 71 deposition, a blanket deposition of conformal poly 72 is preformed that is conductively doped to serve as a top poly capacitor cell plate 72 of the SVC storage capacitor which also becomes a common cell plate to all SVC storage capacitors in the array.

Figure 8:
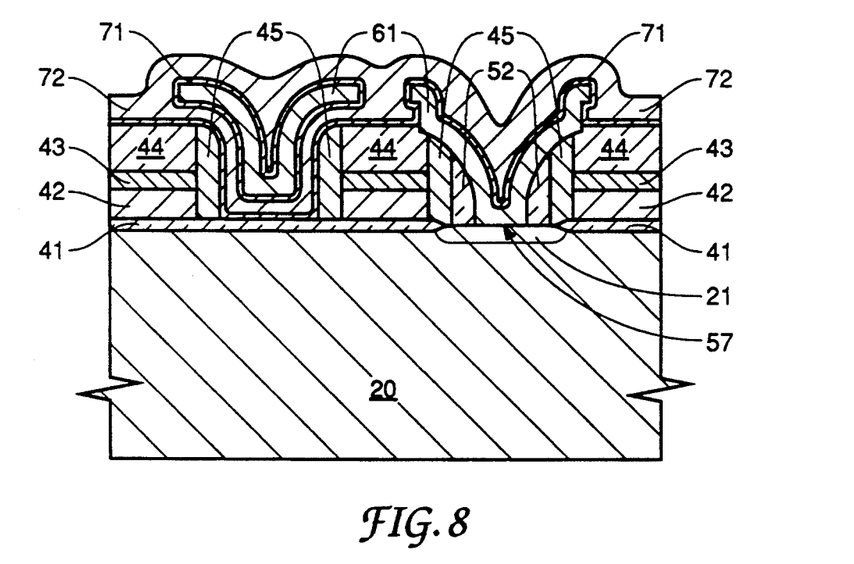
FIG. 8 is a cross-sectional view of the in-process wafer of portion of FIG. 6 following a complete dielectric etch and blanket depositions of conformal nitride and poly.

Dielectric etching is controlled, usually by length of time, to remove the amount of dielectric desired. If this etch step is stopped before all of dielectric 46 is removed, a cross-sectional v-shaped storage-node plate 61, similar to that of FIG. 7 is formed. If the dielectric etch is allowed to completely remove dielectric 46, a cross-sectional flying v-shaped storage node plate 61, similar to that of FIG. 8, is formed.

With the addition of poly plate 61 as the storage node plate along with top capacitor cell plate 72 that surrounds plate 61, substantial capacitor plate surface area is gained at the storage node. Since capacitance is mainly effected by the surface area of a capacitor's cell plates the additional area gained by a 3-dimensional SVC structure can provide an additional 70% increase in capacitance over that of a conventional STC capacitor, without more space than that required for defining a stacked capacitor storage cell.

It is to be understood that although the present invention has been described with reference to a preferred embodiment, various modifications, known to those skilled in the art, may be made to the structures and process steps presented herein without departing from the invention as recited in the several claims appended hereto.

We claim:

1. A process for fabricating a DRAM array on a silicon substrate, said process comprising the steps of:
   creating a plurality of separately isolated active areas arranged in parallel rows and parallel columns;
   creating a gate dielectric layer on top of each active area;
   depositing a first conductive layer superjacent surface of said array;
   depositing a first dielectric layer superjacent said first conductive layer;
   masking and etching said first conductive and said first dielectric layers to form a plurality of parallel conductive word lines aligned along said rows such that each said word line passes over a inner portion of each said active area being separated therefrom by a remnant of said gate dielectric layer;
   creating of a conductively-doped digit line junction and storage node junction within each said active area on opposite sides of each said word line;
   forming first dielectric spacers adjacent vertical edges of patterned word lines;
   depositing a second dielectric layer superjacent the surface of said array;
   creating a first aligned buried contact location at each said digit line junction in each said active area;
   depositing a second conductive layer superjacent said array surface, said second conductive layer making direct contact to said digit line junctions at said first buried contact locations;
   depositing a third dielectric layer superjacent to said second conductive layer;
   masking and etching said second conductive layer and said third dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;
   forming second dielectric spacers adjacent vertical edges of patterned digit lines;
   depositing a disposable dielectric layer superjacent said array surface having said waveform-like topology;
   creating a second aligned buried contact location at each said storage node junction in each said active area;
   depositing a third conductive layer superjacent said array surface, said third conductive layer making contact to said storage node junctions at said second buried contact locations;
   patterning said third conductive layer to form a storage node plate at each said storage node junction, said storage node plate having a v-shaped cross-section;
   isotropically etching substantially all of said disposable dielectric layer;
   depositing a cell dielectric layer adjacent and coextensive the exposed portions of said storage node plate and adjacent said array surface; and
   depositing a fourth conductive layer adjacent and coextensive said cell dielectric layer to form a cell plate common to the entire memory array.

2. A process as recited in claim 1, wherein said first, second, and third dielectric layers and said first and second dielectric spacers are selected from the group consisting essentially of oxide and nitride.

3. A process as recited in claim 1, wherein said disposable dielectric layer comprises oxide.

4. A process as recited in claim 3, wherein said etching of said disposable dielectric comprises a controller phosphoric acid wet etch.

5. A process as recited in claim 1, wherein said disposable dielectric layer comprises nitride.

6. A process as recited in claim 5, wherein said etching of said disposable dielectric comprises a controller hydrofluoric acid wet etch.

7. A process as recited in claim 1, wherein said first and said second buried contacts are self aligned.

8. A process as recited in claim 1, wherein said third, and said fourth conductive layers are doped polysilicon.

9. A process as recited in claim 8, wherein said depositing of said third conductive layer comprises low temperature deposition.

10. A process as recited in claim 1, wherein said depositing of said first, second, third, disposable and cell dielectric layers comprises chemical vapor deposition.

11. A process as recited in claim 1, wherein said cell dielectric layer comprises nitride.

12. A process for fabricating a DRAM array on a silicon substrate, said process comprising the steps of:
   creating a plurality of separately isolated active areas arranged in parallel rows and parallel columns;
   creating a gate oxide layer on top of each active area;
   depositing a first conductive layer superjacent surface of said array;
   depositing a first nitride electric layer superjacent said first conductive layer;
   masking and etching said first conductive and said first nitride dielectric layers to form a plurality of parallel conductive word lines aligned along said rows such that each said word line passes over a inner portion of each said active area being separated therefrom by a remnant of said gate oxide layer;
   creating of a conductively-doped digit line junction and storage node junction within each said active area on opposite sides of each said word line;
   forming first nitride dielectric spacers adjacent vertical edges of patterned word lines;
   depositing a second nitride dielectric layer superjacent the surface of said array;

creating a first self aligned buried contact location at each said digit line junction in each said active area;

depositing a second conductive layer superjacent said array surface, said second conductive layer making direct contact to said digit line junctions at said first buried contact locations;

depositing a third nitride dielectric layer superjacent said second conductive layer;

masking and etching said second conductive layer and said third nitride dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

forming second nitride dielectric spacers adjacent vertical edges of patterned digit lines;

depositing a disposable oxide dielectric layer superjacent said array surface having said waveform-like topology;

creating a second self aligned buried contact location at each said storage node junction in each said active area;

depositing a first conductively doped polysilicon layer superjacent said array surface, said first conductively doped polysilicon layer making contact to said storage node junctions at said second buried contact locations;

patterning said first conductively doped polysilicon layer to form a storage node plate at each said storage node junction, said storage node plate having a v-shaped cross-section;

isotropically etching substantially all of said disposable oxide layer via a controlled phosphoric acid wet etch;

depositing a cell nitride dielectric layer adjacent and coextensive the exposed portions of said storage node plate and adjacent said array surface; and depositing a second conductively doped polysilicon layer adjacent and coextensive said cell dielectric layer to form a cell plate common to the entire memory array.

13. A process as recited in claim 12, wherein said first and said second conductive layers comprise a layer of tungsten silicide and metal.

14. A process as recited in claim 12, wherein said depositing of said first conductively doped polysilicon layer comprises low temperature deposition.

15. A process as recited in claim 12, wherein said depositing of said first, second, third, cell and disposable dielectric layers comprises chemical vapor deposition.

16. A process for fabricating a DRAM array on a silicon substrate, said process comprising the steps of:

creating a plurality of separately isolated active areas arranged in parallel rows and parallel columns;

creating a gate oxide layer on top of each active area;

depositing a first conductive layer superjacent surface of said array;

depositing a first oxide dielectric layer superjacent said first conductive layer;

masking and etching said first conductive and said first oxide dielectric layers to form a plurality of parallel conductive word lines aligned along said rows such that each said word line passes over a inner portion of each said active area being separated therefrom by a remnant of said gate oxide layer;

creating of a conductively-doped digit line junction and storage node junction within each said active area of opposite sides of each said word line;

forming first oxide dielectric spacers adjacent vertical edges of patterned word lines;

depositing a second oxide dielectric layer superjacent the surface of said surface;

creating a first self aligned buried contact location at each said digit line junction in each said active area;

depositing a second conductive layer superjacent said array surface, said second conductive layer making direct contact to said digit line junctions at said first buried contact locations;

depositing a third oxide dielectric layer superjacent said second conductive layer;

masking and etching said second conductive layer and said third oxide dielectric layer to form a plurality of parallel conductive digit lines aligned along said columns such that a digit line makes electrical contact at each digit line junction within a column, said digit lines running perpendicular to and over said word lines forming a 3-dimensional, waveform-like topology;

forming second oxide dielectric spacers adjacent vertical edges of patterned digit lines;

depositing a disposable nitride dielectric layer superjacent said array surface having said waveform-like topology;

creating a second self aligned buried contact location at each said storage node junction in each said active area;

depositing a first conductively doped polysilicon layer superjacent said array surface, said first conductively doped polysilicon layer making contact to said storage node junctions at said second buried contact locations;

patterning said first conductively doped polysilicon layer to form a storage node plate at each said storage node junction, said storage node plate having a v-shaped cross-section;

isotropically etching substantially all of said disposable nitride layer via a controlled hydrofluoric acid wet etch;

depositing a cell nitride dielectric layer adjacent and coextensive the exposed portions of said storage node plate and adjacent said array surface; and depositing a second conductively doped polysilicon layer adjacent and coextensive said cell dielectric layer to form a cell plate common to the entire memory array.

17. A process as recited in claim 16, wherein said first and said second conductive layers comprise a layer of tungsten silicide and metal.

18. A process as recited in claim 16, wherein said depositing of said first conductively doped polysilicon layer comprises low temperature deposition.

19. A process as recited in claim 16, wherein said depositing of said first, second, third, cell and disposable dielectric layers comprises chemical vapor deposition.

* * * * *